United States Patent
Hayter et al.

(10) Patent No.: US 9,466,385 B1
(45) Date of Patent: Oct. 11, 2016

(54) METHODS AND APPARATUS RELATED TO A WRITE PROTECT FASTENER

(71) Applicant: GOOGLE INC., Mountain View, CA (US)

(72) Inventors: Mark D. Hayter, Menlo Park, CA (US); Frank R. Hislop, Sunnyvale, CA (US); Olof Johansson, Belmont, CA (US)

(73) Assignee: Google Inc., Mountain View, CA (US)

(*) Notice: Subject to any disclaimer, the term of this patent is extended or adjusted under 35 U.S.C. 154(b) by 572 days.

(21) Appl. No.: 13/850,813

(22) Filed: Mar. 26, 2013

Related U.S. Application Data

(60) Provisional application No. 61/715,259, filed on Oct. 17, 2012.

(51) Int. Cl.
| | |
|---|---|
| G11C 16/04 | (2006.01) |
| G11C 16/22 | (2006.01) |
| G11C 16/10 | (2006.01) |
| G11C 7/24 | (2006.01) |

(52) U.S. Cl.
CPC .............. G11C 16/22 (2013.01); G11C 16/10 (2013.01); G11C 7/24 (2013.01)

(58) Field of Classification Search
CPC ...... G11C 16/10; G11C 16/102; G11C 16/22; G11C 11/5628; G11C 16/3459; G11C 5/06; G11C 11/34; G11C 19/28
See application file for complete search history.

(56) References Cited

U.S. PATENT DOCUMENTS

| | | | | |
|---|---|---|---|---|
| 3,342,967 A | * | 9/1967 | Brand | H01H 1/403 200/339 |
| 4,811,293 A | * | 3/1989 | Knothe | G11C 16/22 365/185.02 |
| 5,381,369 A | * | 1/1995 | Kikuchi | G11C 16/22 365/185.04 |
| 6,319,018 B1 | * | 11/2001 | Daoud | H01R 9/096 439/65 |
| 2005/0037659 A1 | * | 2/2005 | Wu | G06K 7/0021 439/374 |
| 2005/0099873 A1 | * | 5/2005 | Yoshida | G06F 1/30 365/226 |
| 2005/0246731 A1 | * | 11/2005 | Tamura | G11B 23/0302 720/729 |
| 2006/0158041 A1 | * | 7/2006 | Caldwell | A47B 57/00 307/116 |
| 2008/0037308 A1 | * | 2/2008 | Hiew | G06K 19/077 365/52 |
| 2008/0126677 A1 | * | 5/2008 | Fujita | G06F 3/0623 711/103 |
| 2010/0265785 A1 | * | 10/2010 | Lee | G11C 5/005 365/229 |

OTHER PUBLICATIONS

American Casting and Manufacturing, Cup Seals, May 17, 2011, p. 1.*

* cited by examiner

*Primary Examiner* — Son Dinh
*Assistant Examiner* — Uyen B Tran
(74) *Attorney, Agent, or Firm* — Brake Hughes Bellermann LLP

(57) ABSTRACT

In a general aspect, a circuit can include a printed circuit board having an opening defined therein and an electrical write line disposed on the circuit board. The electrical write line can be connected to a semiconductor memory device, and be configured to transmit a write voltage signal to the semiconductor memory device to write data therein in a write mode of the circuit. The circuit can also include an input voltage terminal disposed on the circuit board. The input voltage terminal can be configured to receive a write-protection voltage. The circuit can also include a reversible closing element that, when inserted in the opening in the circuit board, electrically connects the electrical write line and the input voltage terminal to pass the write-protection voltage to the electrical write line connected to the semiconductor memory device to reversibly enable a write-protect mode of the circuit.

17 Claims, 6 Drawing Sheets

810
Applying a write-protection voltage to an input voltage terminal on a printed circuit board carrying a semiconductor memory device (e.g., by grounding the input voltage terminal)

820
Using a reversible mechanical fastener to electrically connect the input voltage terminal to an electrical write-data line of the semiconductor memory device to pass the write-protection voltage to the semiconductor memory device

- 821 using of the reversible mechanical fastener to electrically short the opposing open terminals of the electrical switch

- 822 using a mechanically movable conductor arranged on the printed circuit board to contact the opposing open terminals in a closed position of the electrical switch

- 823 inserting a fastener in an opening in the printed circuit board to contact the opposing open terminals in a closed position of the electrical switch

- 824 passing the write-protection voltage across a resistor element interposed in the electrical write-data line between the input voltage terminal and the semiconductor memory device

- 825 placing a tamper-evident seal on the reversible mechanical fastener after using the reversible mechanical fastener to electrically connect the input voltage terminal to the electrical write-data line of the semiconductor memory device

FIG. 8

METHODS AND APPARATUS RELATED TO A WRITE PROTECT FASTENER

TECHNICAL FIELD

This description generally relates to computing devices. The description, in particular, relates to controlling modification or erasure of data written on storage media in a computing device.

BACKGROUND

Write protection is a mechanism through which modification or erasure of valuable data on a computing device can be prevented. Some known methods for write protection can be relatively easy to circumvent, which can result in the compromise of key stored data within a computing device. Thus, a need exists for systems, methods, and apparatus to address the shortfalls of present technology and to provide other new and innovative features.

SUMMARY

In one general aspect, an apparatus can include a memory, a first conductor electrically coupled to the memory, and a second conductor electrically coupled to a write-protect voltage. The memory can be configured to be write-protected in response to the first conductor being electrically coupled to the second conductor via a fastener.

In an aspect, the first conductor and the second conductor are coupled to a printed circuit board, the second conductor is insulated from the first conductor via a portion of the printed circuit board.

In some implementations, the first conductor and the second conductor are coupled to a printed circuit board, and the printed circuit board has an opening disposed between the first conductor and the second conductor.

In some implementations, the first conductor and the second conductor are coupled to a printed circuit board, and the printed circuit board has an opening disposed within the first conductor.

In some implementations, the memory is associated with at least one of an electrically erasable programmable read-only memory (EEPROM) or a basic input/output system (BIOS). In some implementations, the memory is configured to be write-enabled in response to the first conductor being electrically decoupled from the second conductor.

In another general aspect, an apparatus can include a first conductor electrically coupled to a memory, and a second conductor electrically coupled to a write protect voltage where the memory is configured to be write-protected in response to the first conductor electrically coupled to the second conductor via a conductive material.

In some implementations, the conductive material is at least one of a conductive grease, a conductive clip, or a conductive washer. In some implementations, the conductive material is biased away from the first conductor and the second conductor, and the conductive material is configured to be electrically coupled the first conductor to the second conductor in response to a force applied to the conductive material.

In some implementations, the apparatus can include a printed circuit board, and the first conductor and the second conductor can be coupled to the printed circuit board. The apparatus can include at least a portion of a housing of a computing device where the conductive material is disposed between the housing of the computing device when the housing is coupled to the printed circuit board via a fastener. In some implementations, the first conductor is concentrically located with respect to the second conductor.

In one general aspect, an electronic circuit for providing write-protection for a memory component housed in a computing device (e.g., a laptop, tablet, desktop, smart phone, etc.) includes an electrical write line connected to a semiconductor memory device. The electrical write line is configured to transmit a write voltage signal to the semiconductor memory device to write data therein, in a write mode of the circuit. The circuit further includes an input voltage terminal configured to receive a write-protection voltage. An electrical switch that has a mechanical closing element, is interposed between the input voltage terminal and the electrical write line. The electrical switch in its closed position passes the write-protection voltage from the input voltage terminal to the electrical write line connected to the semiconductor memory device, in a write-protect mode of the circuit.

In an aspect, the circuit is fabricated on a printed circuit board. Input and output terminals (i.e. open terminals) of the electrical switch can be formed by conducting pads disposed on the printed circuit board. Further, the mechanical closing element of the electrical switch is a mechanically movable conductor, which is arranged on the printed circuit board (e.g., spring biased) to electrically short the open terminals in the closed position of the electrical switch. In alternative implementations of the circuit, the mechanical closing element of the electrical switch is a fastener that can be inserted in or clamped on the printed circuit board to electrically short the open terminals in the closed position of the electrical switch.

In a general aspect, a method for providing write-protection for a memory component housed in a computing device (e.g., a laptop, tablet, desktop, smart phone, etc.) includes providing a printed circuit board having a first conductor coupled to a memory and a second conductor coupled to a write protect voltage, and coupling the first conductor to the second conductor via a fastener such that write-protection of the memory is activated. The method can include placing a tamper-evident seal on the fastener after the write-protection of the memory is activated.

In a general aspect, a method for providing write-protection for a memory component housed in a computing device (e.g., a laptop, tablet, desktop, smart phone, etc.) includes applying a write-protection voltage to an input voltage terminal on a printed circuit board carrying a semiconductor memory device. The method further includes using a reversible mechanical fastener to electrically connect the input voltage terminal to an electrical write-data line of the semiconductor memory device to pass the write-protection voltage to the semiconductor memory device.

The details of one or more implementations are set forth in the accompanying drawings and the description below. Other features will be apparent from the description and drawings, and from the claims.

BRIEF DESCRIPTION OF THE DRAWINGS

FIGS. 1A-1E are schematic diagrams illustrating an example arrangement of a write-protect switch mechanism and a write-protect fastener.

FIGS. 7 and 8 are flowcharts illustrating an example methods for providing write-protection for a memory component housed in a computing device (e.g., a laptop, tablet, desktop, smart phone, etc.).

Like reference symbols in the various drawings indicate like elements.

DETAILED DESCRIPTION

Figure 1B:
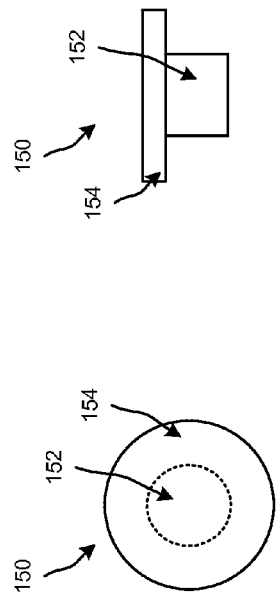

A write-protect switch mechanism is provided for write protection in a computing device, in accordance with the principles of the disclosure herein. Write protection of data (e.g., operating system (OS) data, a basic input/output system (BIOS) data, an electrically erasable programmable read-only memory (EEPROM) data, embedded controller data, and/or so forth), which may be recorded on one or more chips (e.g., flash memory) on a circuit board in the computing device, may be activated by using the write-protect switch mechanism. In some embodiments, data can include software that may be written in memory in a computing device. In some embodiments, the computing device can be a laptop computing device, a mobile phone, a tablet device, a television with one or more processors, and/or so forth.

The write-protect switch mechanism may include a write-protect fastener (e.g., screw, rivet, press-fit pin, clip, and/or so forth) as a conductive contacting element in an electromechanical switch arrangement to break or close an electrical circuit line (e.g., a grounding line) connected to a chip (e.g., a memory) on a circuit board (e.g., motherboard, a communication card, etc.) in the computing device. The electrical circuit line may, for example, be a grounding line connected to a write-protect pin of the chip (e.g., a BIOS flash memory). The write-protect fastener may be a fastener that also serves as a conventional structural element to mechanically hold components (e.g. motherboard and casing (or housing)) of the computing device together. The electromechanical switch arrangement may include a fastener hole (e.g., opening), annular (or concentric) features (e.g., rings), insulating material, a slit, and/or so forth, which creates a break in the electrical circuit line on the circuit board. A discontinuous but conductive metal pad may be disposed on the circuit board about the fastener hole to form a pair of terminal contacts across the break in the electrical circuit line. In a write-protect mode, the write-protect fastener may be placed in the fastener hole to short the terminal contacts across the break in the electrical circuit line to, for example, ground the electrical circuit line. In a write-unprotect mode, the write-protect fastener may be partially or fully removed (e.g., decoupled) from the fastener hole, disengaging it from the terminal contacts across the break in the electrical circuit line (e.g., a grounding line).

In implementations where the write-protect fastener functions as a structural element to mechanically hold components of the computing device together, a conductive material can be disposed between the write-protect fastener and terminals of the write-protect switch mechanism to activate or deactivate write protection. For example, a clip, a washer, or a spring-loaded mechanism can be mechanically coupled to the write-protect switch mechanism to activate the write protection of the write-protect switch mechanism. Also, the conductive material may be removed to deactivate the write protection of the write-protect switch mechanism.

In a computing device assembly that includes a casing or housing, which, for example, encloses the circuit board and supports a display panel, the write-protect switch mechanism may be disposed in a location within the casing that is not readily accessible without having to disassemble or open the computing device casing. The write-protect switch mechanism may, for example, be disposed on a portion of the computing device circuit board underneath the display panel or underneath a panel within a base portion of the computing device. The write-protect switch mechanism may be disposed in a location within the casing that is not readily accessible so that only those authorized to access the write-protect switch mechanism may be able to do so in a desirable fashion.

The write-protect switch mechanism may be further sealed (e.g., with epoxy or other means) that may provide a visual indication of an event in which the write-protect fastener is removed (e.g., with the casing or housing opened). The write-protect switch mechanism may be sealed in a manner that may make tampering evident upon visual inspection.

In some implementations, the write-protect switch mechanism may include a conductive material such as a conductive grease, a conductive tape, a conductive paint, and/or so forth as a conductive contacting element in the electromechanical switch arrangement to close an electrical circuit line (e.g., a grounding line) connected to a chip (e.g., a memory) on a circuit board to activate the write protection of the write-protect switch mechanism. In such implementations, the conductive material may be removed to deactivate the write protection of the write-protect switch mechanism.

FIGS. 1A-1E are schematic diagrams illustrating an example arrangement of a write-protect switch mechanism 11 on a printed circuit board (PCB) 110 that can be included in a computing device and a write-protect fastener 150, in accordance with the principles of disclosure herein.

Figure 1A:
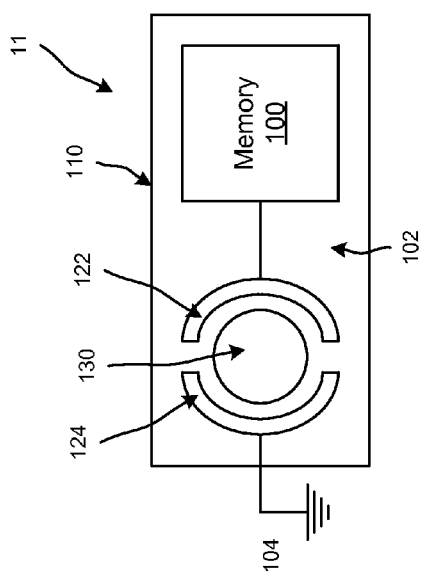
Figure 1D:
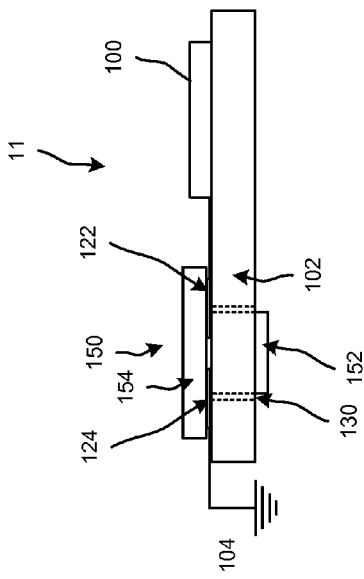
Figure 1D:
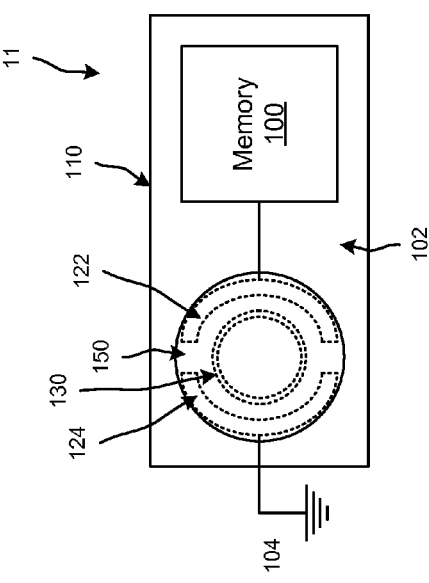

With reference to FIGS. 1A and 1D, the write-protect switch mechanism 11 includes a memory 100 (e.g., a flash memory), which serves as a storage medium for the computing device's data and software may be mounted on (e.g., coupled to) PCB 110. Write-protect switch mechanism 11 may be configured to provide reversible (or irreversible) write protection for memory 100.

Write-protect switch mechanism 11 may include open terminals formed by conductors 122 and 124 (which also can be referred to as contact regions) on PCB 110. Conductors 122 and 124 may be metal or metallic pads (e.g., copper pads) that are printed on PCB 110 by usual printed circuit fabrication techniques. Conductors 122 and 124 may be insulated from each other, for example, by intervening PCB 110 material (or another material (not shown)). Conductors 122 and 124 may be disposed about an opening 130, which may extend fully or partially through the thickness of PCB board 110. In example implementations, opening 130 may be aligned over a hollow post that mechanically supports PCB 100 in the computing device. Opening 130 may provide a break in electrical circuit line 102 that leads from memory 100 to a write-protect voltage source (e.g., ground voltage 104, a high voltage (not shown)).

With reference to FIGS. 1C-1D, a write-protect fastener 150 may serve a closing element in write-protect switch mechanism 11. FIGS. 1B and 1C show a top plan view and a cross-sectional view of an example write-protect fastener 150. Write-protect fastener 150 may include a protruding or fixation element 152 and a fastener head 154. Fixation element 152 may be designed to be retained in opening 130 in PCB 110. Fastener head 154 whose dimensions may be large enough to bridge the distance between conductors 122 and 124 may be designed to short conductors 122 and 124, which serve as the open terminals of write-protect switch mechanism 11, when write-protect fastener 150 is fully inserted in opening 130.

FIGS. 1D and 1E are top plan and side views, respectively, of an example deployment of write-protect fastener 150 deployed to close the open terminals of write-protect switch mechanism 11. As shown in these figures, in a write-protect mode of write-protect switch mechanism 11, write-protect fastener 150 is inserted or installed in opening 130 so that fastener head 154 rests on PCB 110. The under surface of fastener head 154 may contact conductors 122 and 124 and provide a conductive path to close write-protect switch mechanism 11.

In practice, a body of write-protect fastener 150 may be made of any conductive (e.g., metallic) or non-conductive materials (e.g., plastics, Teflon, etc.). However, at least the under surface of fastener head 154 may be made of conductive material to provide a conductive path between conductors 122 and 124 (i.e. the open terminals of write-protect fastener switch 11) when write-protect fastener 150 is fully inserted in opening 130. In some implementations, write-protect fastener 150 may be made of non-conductive material. In such implementations, a metal washer may be inserted between PCB 110 and non-conductive fastener 150 to provide a short between conductors 122 and 124 to close write-protect switch mechanism 211.

Figure 2:
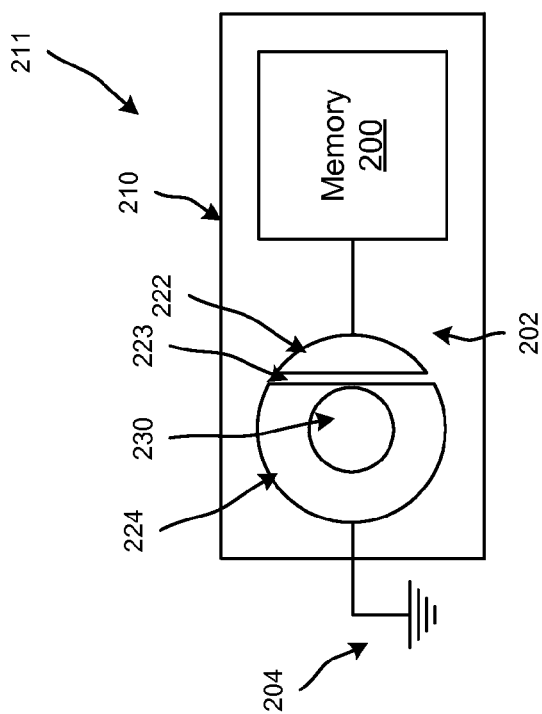
FIG. 2 illustrates another example arrangement of the open terminals of write-protect switch mechanism.

FIG. 2 illustrates another example arrangement of the open terminals of write-protect switch mechanism 211. In the arrangement as shown, computing device memory 200 may be mounted on PCB 210 with an electrical circuit line 202 that leads from memory 200 to a write-protect voltage source (e.g., ground voltage 204). PCB 210 may be supported above hollow posts or spacers (not shown) in place in the computing device. PCB 210 may be structurally held in place by a write-protect fastener (not shown) that extends through opening 230 in PCB 210. Opening 230 may be surrounded by a conductor 222 (which can be a ground pad) disposed on PCB 210. In this arrangement, a break in electrical circuit line 202 that leads from memory 200 to write-protect voltage source 204 may be provided by a slot 223 (which can have various shapes or profiles different than shown in this embodiment) in conductor 222. Slot 223 may separate conductor 222 from conductor 224, which may serve as the open terminals of write-protect switch mechanism 211. The closing element of write-protect switch mechanism 211 in the arrangement of FIG. 2 may be a fastener (e.g., write-protect fastener 150 shown in FIG. 1B) that is inserted in opening 230 to short conductors 222 and 224. In some embodiments, at least some portions of a sidewall of the opening 230 can include a conductive material that is electrically coupled to the conductor 224.

Figure 3:
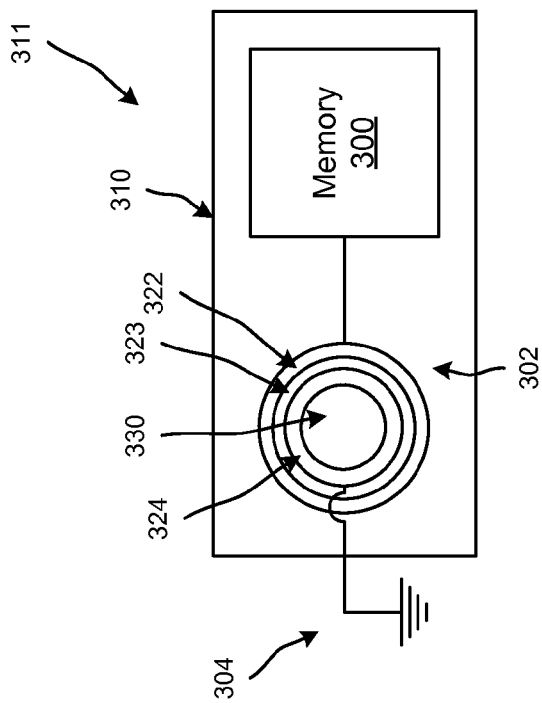
FIG. 3 illustrates another example arrangement of the open terminals of write-protect switch mechanism.

FIG. 3 illustrates another example arrangement of the open terminals of write-protect switch mechanism 311. In arrangement as shown, computing device memory 300 may be mounted on PCB 310. PCB 310 may be supported in place in the computing device above hollow posts or spacers (not shown). PCB 310 may be structurally held in place by a write-protect fastener that extends through opening 330 in PCB 310. Opening 330 may surround a metal plated hole, which may provide a center ground in this arrangement. The open terminals of write-protect switch mechanism 311 may be formed by annular conductive pads or rings 322 and 324 (which can each be referred to as conductors), which may be concentric with opening 330. Outer and inner conductive rings 322 and 324, respectively, may be physically separated by an insulating gap or annulus 323, which may provide a break in electrical circuit line 302 that leads from memory 300 to a write-protect voltage source (e.g., ground voltage 304) that is connected, for example, to inner annular conductive ring 324. The closing element of write-protect switch mechanism 311 in arrangement may be a write-protect fastener (e.g., write-protect fastener 150 shown in FIG. 1B) that may be inserted in opening 330 to short annular conductive rings 322 and 324.

With plated-through hole or opening 330, it may be easier to use a center ground and enable write protection (i.e., maintain a write-protection voltage) on outer annular ring 322. The write-protect fastener insertion (e.g., write-protect fastener 150) may make a solid conductive contact across insulating gap or annulus 323 between inner and outer and inner rings 322 to ensure that write protection is enforced by maintaining a write protection voltage on electrical circuit line 302 that leads from memory 200.

Figure 4:
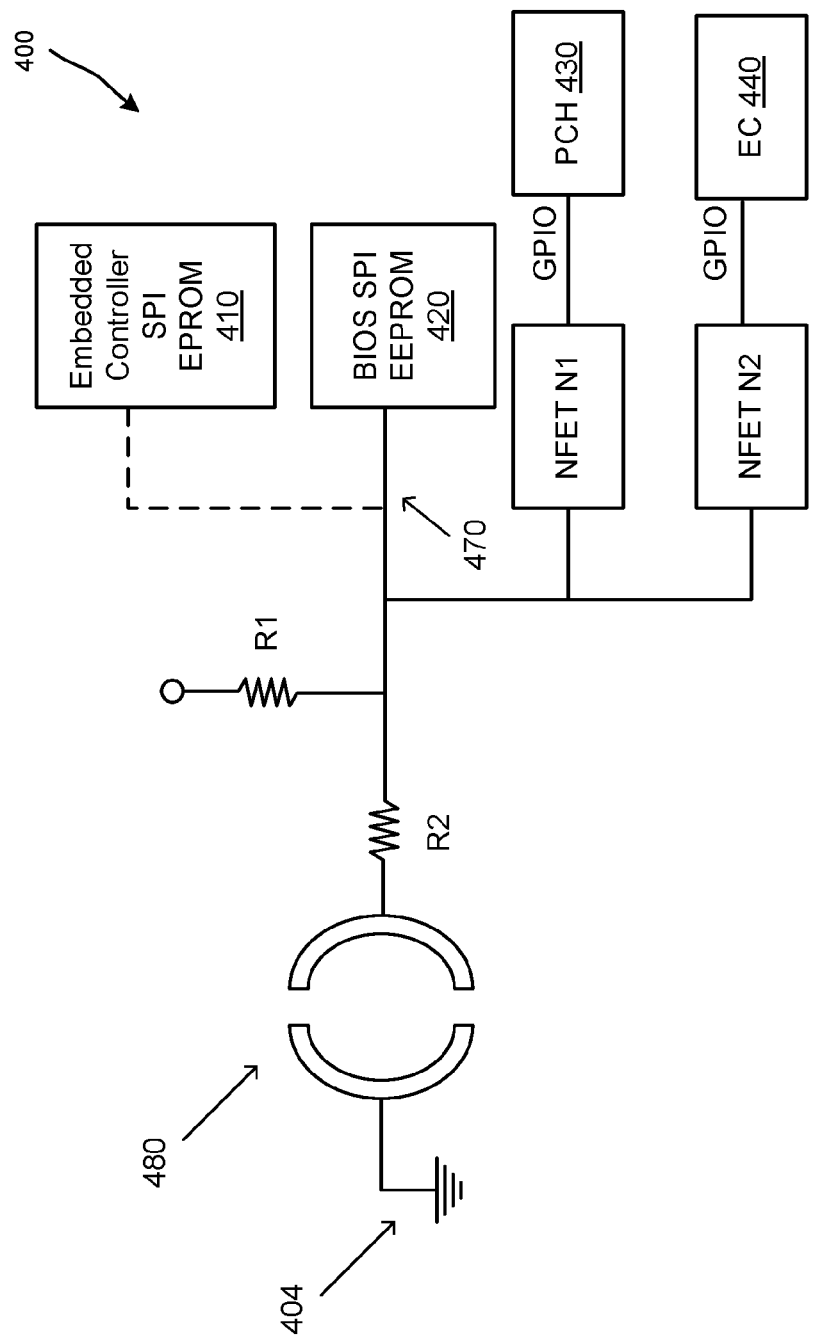
FIG. 4 is a circuit diagram illustrating an example circuit for a write-protect switch implementation to enforce write protection for computer components housed in a computing device.

FIG. 4 is a circuit diagram showing an example circuit 400 for a write-protect switch implementation to enforce write protection for computer components housed in a computing device, in accordance with the principles of the disclosure herein.

The computer components, which may be mounted on a printed circuit board, in the computing device may, for example, include a BIOS SPI EEPROM 420 and optionally an Embedded Controller SPI EPROM 410. In circuit 400, "write" electrical circuit lines 470 or bus for EEPROM 420 and EEPROM 410 may be connected to general purpose input output pins (GPIO) pins of platform controller hubs PCH 440 and EC 430 via isolating circuits (e.g. via n-type field effect transistors (NFETs) N1 and N2, respectively). The outputs of NFETs N1 and N2 may be used by management engines or platform controller hubs EC 430 and PCH 440 to read a write-protection state of electrical circuit lines or bus 470 but the isolation may prevent the management engines or platform controller hubs EC 430 and PCH 440 from being able to modify the write-protection state. It will be also understood that other isolation methods (e.g., high value resistors) may be used achieve this effect of being able to read without modifying the write-protection state.

Circuit 400 may include a mechanical switch 480 in electrical circuit lines 470 or bus for isolating or connecting electrical circuit lines 470 or bus to a write-protection voltage signal source (e.g. ground 404). Mechanical switch 480 may be a switch mechanism of a type (e.g. described above with reference to FIGS. 1A-1D, 2 and 3) in which a closing element of the switch is a fastener that is inserted in an opening or hole in the printed circuit board between open terminals of the switch formed by conducting pads disposed on the printed circuit board. For visual clarity, the fastener opening and fastener in mechanical switch 480 are not shown in FIG. 4. FIG. 4 shows only the open terminals of mechanical switch 480 formed by conducting pads disposed on the printed circuit board.

In operation in a write-protect mode, when mechanical switch 480 is closed a write-protection signal from the fastener hole may be connected across a resistor R2 (e.g., 1 KΩ) in electrical circuit lines bus 470 to a write-protect pin of the BIOS flash (e.g., EEPROM 420) (and a write-protect pin of the embedded controller flash (e.g., EEPROM 410) in designs where the embedded controller has an external flash). The write-protect pin may be pulled up to the SPI flash supply voltage through a resistor R1 (e.g., 10 KΩ). To allow the system to read the protection state but not change the state, an isolated copy of the signal may be passed to a GPIO pin on PCH 440 or SoC. This isolation (i.e. allowing the system to read but not write) may be accomplished using an inverting FET (e.g., NFET N1) in systems in which PCH may have a different power well. Alternatively, in systems in which the power well is the same, the isolation may be accomplished by using a suitable large-value resistor (e.g., 100 KΩ) and/or an inverting FET.

Similarly, to allow EC 440 to read the protection state but not change the state, an isolated copy of the signal may be passed to a GPIO pin on EC 440. This isolation may be accomplished using an inverting FET (e.g., FET N2) on systems in which PCH may have a different power well. It will be noted that circuit 400 may include different isolation circuits (e.g., FET N1 and FET N2) for PCH 430 and EC 440. PCH 430 and EC 440 may have their own separate FET (or similar isolation circuit) so that they can be individually isolated from each other and also from EEPROMS 410 and 420.

Figure 5:
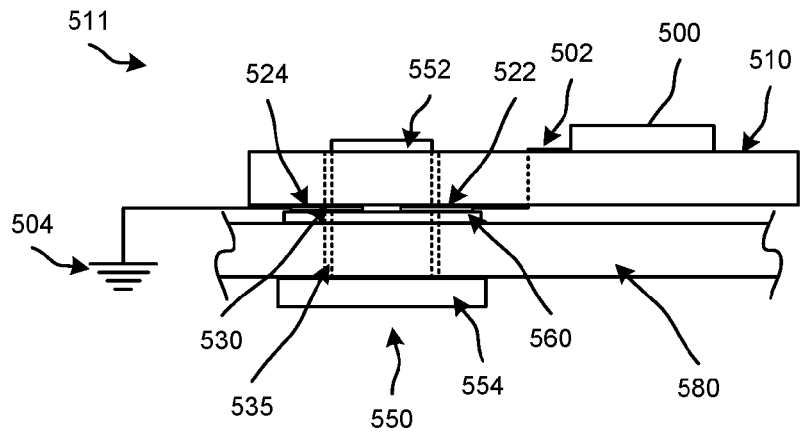
FIG. 5 illustrates a further example arrangement of a write-protect switch mechanism.

FIG. 5 shows a further example arrangement of a write-protect switch mechanism 511 in which a structural element (e.g., similar to fastener 150) that is used to physically or mechanically hold computing device components together in a housing or casing may also serve as part of a closing element of a write-protect switch. In the arrangement as shown, computing device memory 500 may be mounted on PCB 510 with an electrical circuit line 502 that leads from memory 500 to a write-protect voltage source (e.g., ground voltage 504). Like PCB 110 or 210 or 310, PCB 510 may include an opening 530 about which conductive pads or rings 522 and 524 may be disposed to form the open terminals of a write-protect switch. PCB 510 may be structurally held in place in the computing device by a write-protect fastener 550 that extends from outside of computing device through an opening 535 in a casing 580 (or housing) and through opening 530 in PCB 210 inside of the casing 580. In the example shown, write-protect fastener 550 (like write-protect fastener 150) may include a protruding or fixation element 552 and a fastener head 554. Fixation element 552 may be designed to be retained in opening 530 between conductive pads or rings 522 and 524 (also can be referred to as conductors) in PCB 510, but unlike the previous examples, fastener head 554 may rest on the outside of casing 580. A conductive material 560 (e.g., a metal washer, a nut, a conductive grease, a clip, a conductive paint, or other conductive material) disposed inside casing 580 about fixation element 552 may be used as the closing element of the write-protect switch.

In this arrangement, when casing 580 and PCB 510 are held together by tightening fastener 550, conductive material 560 may be pressed against conductive pads or rings 522 and 524 closing the write-protect switch. Conversely, when fastener 550 is removed or loosened to separate casing 580 and PCB 510, washer 560 may disengage from conductive pads or rings 522 and 524 to open the write-protect switch.

Figure 6:
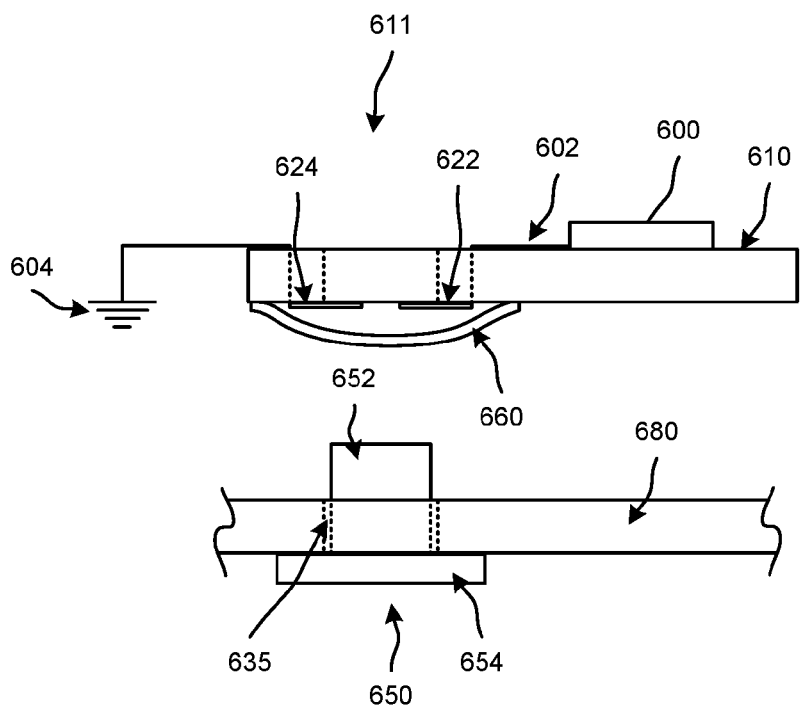
FIG. 6 illustrates yet another example arrangement of a write-protect switch mechanism.

FIG. 6 illustrates yet another example arrangement of a write-protect switch mechanism 611 in which an element (e.g., similar to conductive material 560) that is disposed inside of a computing device casing, but is activated from outside the casing, serves as a closing element of a write-protect switch.

In the arrangement as shown, computing device memory 600 may be mounted on PCB 610 with an electrical circuit line 602 that leads from memory 600 to a write-protect voltage source (e.g., ground voltage 604). Like PCB 110, 210, 310, or 510, PCB 610 may have conductive pads or rings 622 and 624 (also can be referred to as conductors) disposed thereon to form the open terminals of a write-protect switch. A conductive material 660 (e.g., a moveable element, an elastic metal strip, a leaf spring) attached to PCB 610, which may be stretched or elastically biased above or away from the open terminals (in open position), may serve as the closing element for the write-protect switch. The conductive material 660 may be moved to contact conductive pads or rings 622 and 624 to close the write protect switch by a write-protect fastener 650 that extends from outside of computing device through an opening 635 in casing 680 (or housing). In the example shown, write-protect fastener 650 (like write-protect fastener 550) may include a protruding or fixation element 652 and a fastener head 654. Fixation element 652 may be designed to be retained in opening 635 in casing 680 and to reversibly press the conductive material 660 against conductive pads or rings 622 and 624 to open or close the write protect switch.

It will be understood that the individual features or elements of the various write-protect switch mechanisms described herein (e.g., with reference to FIGS. 1A-1E, and 2-6) are not confined or limited to the particular write-switch mechanisms implementation in which they may be first shown or described. These features and elements may be used in any appropriate combination (or omitted) in write-protect mechanisms that may implemented in accordance with the principles of the disclosure herein. For example, the conductors shown in FIG. 2, 3, or 4 can be incorporated into the write-protect switch mechanism shown in FIG. 5. As another example, the conductors shown in FIG. 2, 3, or 4 can be incorporated into the write-protect switch mechanism shown in FIG. 6.

Figure 7:
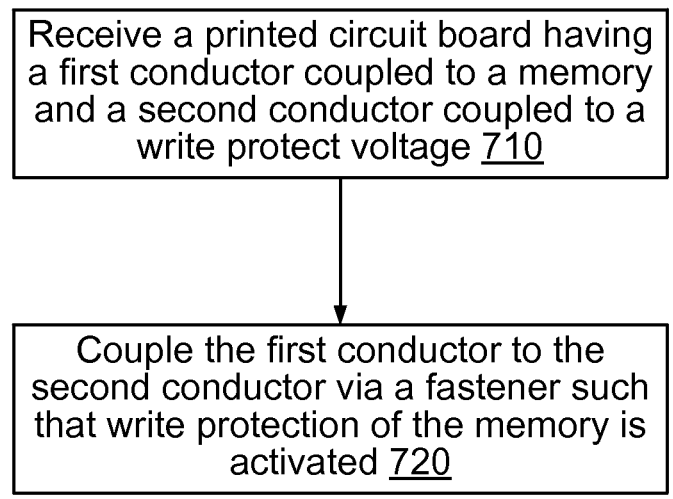

FIG. 7 is flowchart illustrating an example method 700 for providing write-protection for a memory component housed in a computing device (e.g., a laptop, tablet, desktop, smart phone, etc.). Method 700 may include providing a printed circuit board having a first conductor coupled to a memory and a second conductor coupled to a write-protect voltage (710) and coupling the first conductor to the second conductor via a fastener such that write-protection of the memory is activated (720). Method 700 may include placing a tamper-evident seal on the fastener after the write-protection of the memory is activated.

In one general aspect, an apparatus can include a memory, a first conductor electrically coupled to the memory, and a second conductor electrically coupled to a write protect voltage where the memory is configured to be write-protected in response to the first conductor being electrically coupled to the second conductor via a fastener.

In some implementations, the first conductor and the second conductor are coupled to a printed circuit board, the second conductor is insulated from the first conductor via a portion of the printed circuit board.

In some implementations, the write protect voltage is a ground voltage. In some implementations, the first conductor and the second conductor are coupled to a printed circuit board, and the printed circuit board has an opening disposed between the first conductor and the second conductor.

In some implementations, the first conductor and the second conductor are coupled to a printed circuit board, and the printed circuit board has an opening disposed within the first conductor. In some implementations, the memory is associated with at least one of an electrically erasable programmable read-only memory (EEPROM) or a basic input/output system (BIOS). In some implementations, the memory is configured to be write-enabled in response to the first conductor being electrically decoupled from the second conductor.

In another general aspect, an apparatus can include a first conductor electrically coupled to a memory, and a second conductor electrically coupled to a write protect voltage where the memory is configured to be write-protected in response to the first conductor electrically coupled to the second conductor via a conductive material.

In some implementations, the conductive material is at least one of a conductive grease, a conductive clip, or a conductive washer. In some implementations, the conductive material is biased away from the first conductor and the second conductor, and the conductive material is configured to be electrically coupled the first conductor to the second conductor in response to a force applied to the conductive material.

In some implementations, the apparatus can include a printed circuit board, and the first conductor and the second conductor can be coupled to the printed circuit board. The apparatus can include at least a portion of a housing of a computing device where the conductive material is disposed between the housing of the computing device when the housing is coupled to the printed circuit board via a fastener. In some implementations, the first conductor is concentrically located with respect to the second conductor.

An electronic circuit for providing write-protection for a memory component housed in a computing device (e.g., a laptop, tablet, desktop, smart phone, etc.) includes an electrical write line connected to a semiconductor memory device. The electrical write line may be configured to transmit a write voltage signal to the semiconductor memory device to write data therein, in a write mode of the circuit. The circuit further includes an input voltage terminal configured to receive a write-protection voltage. An electrical switch, which may have a mechanical closing element, is interposed between the input voltage terminal and the electrical write line. The electrical switch in its closed position passes the write-protection voltage from the input voltage terminal to the electrical write line connected to the semiconductor memory device, in a write-protect mode of the circuit. The circuit may include a resistor element or other resistor arrangements interposed in the electrical write line leading to a write-protect pin of the semiconductor memory device. The resistor element or resistor arrangements may, for example, function as a biasing element or a voltage divider.

The foregoing circuit may, for example, be fabricated on a printed circuit board. The input voltage terminal may be a ground voltage terminal on the printed circuit board. The input and output terminals (i.e. open terminals) of the electrical switch may, for example, be formed by conducting pads disposed on the printed circuit board. Further, the mechanical closing element of the electrical switch may, for example, be a mechanically movable conductor, which is arranged on the printed circuit board (e.g., spring biased) to electrically short the open terminals in the closed position of the electrical switch. In alternative implementations of the circuit, the mechanical closing element of the electrical switch may, for example, be a fastener that can be inserted in or clamped on the printed circuit board to electrically short the open terminals in the closed position of the electrical switch.

FIG. 8 is flowchart illustrating an example method 800 for providing write-protection for a memory component housed in a computing device (e.g., a laptop, tablet, desktop, smart phone, etc.). Method 800 may include applying a write-protection voltage to an input voltage terminal on a printed circuit board carrying a semiconductor memory device (810) and using a reversible mechanical fastener to electrically connect the input voltage terminal to an electrical write-data line of the semiconductor memory device to pass the write-protection voltage to the semiconductor memory device (820).

In method 800, applying a write-protection voltage to an input voltage terminal 810 may include grounding the input voltage terminal. Further, the electrical write-data line may be configured to apply the write-protection voltage received at the input voltage terminal to a write-protect pin of the semiconductor memory device. The input voltage terminal and the electrical write-data line may be connected to opposing open terminals of an electrical switch formed by conducting pads disposed on the printed circuit board.

In method 800, using a reversible mechanical fastener to electrically connect the input voltage terminal to an electrical write-data line of the semiconductor memory device to pass the write-protection voltage to the semiconductor memory device 820 may include electrically shorting the opposing open terminals of the electrical switch (821). The reversible mechanical fastener may be mechanically movable conductor arranged on the printed circuit board (e.g., spring biased) to contact the opposing open terminals in a closed position of the electrical switch (822), or may be a fastener (e.g., a screw) that can be clamped on or inserted in a opening in the printed circuit board for the same purpose (823). Further, method 800 may include passing the write-protection voltage across a resistor element interposed in the electrical write-data line between the input voltage terminal and the semiconductor memory device (824). The method may also include placing a tamper-evident seal on the reversible mechanical fastener after using the reversible mechanical fastener to electrically connect the input voltage terminal to the electrical write-data line of the semiconductor memory device to pass the write-protection voltage to the semiconductor memory device (825).

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device (computer-readable medium, a non-transitory computer-readable storage medium, a tangible computer-readable storage medium) or in a propagated signal, for processing by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the processing of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A circuit comprising:
    a printed circuit board having an opening defined therein;
    an electrical write line disposed on the circuit board, the electrical write line being connected to a semiconductor memory device, the electrical write line configured to transmit a write voltage signal to the semiconductor memory device to write data therein in a write mode of the circuit;
    an input voltage terminal disposed on the circuit board, the input voltage terminal being configured to receive a write-protection voltage; and
    a reversible closing element that, when inserted in the opening in the circuit board, electrically connects the electrical write line and the input voltage terminal to pass the write-protection voltage to the electrical write line connected to the semiconductor memory device to reversibly enable a write-protect mode of the circuit.

2. The circuit of claim 1, wherein the input voltage terminal is a ground voltage terminal.

3. The circuit of claim 1, wherein open terminals of the electrical write line and the input voltage terminal are formed by respective conducting pads disposed about the opening on the printed circuit board.

4. The circuit of claim 3, wherein the reversible closing element is a mechanically insertable and removable conductor arranged to electrically short the open terminals of the electrical write line and the input voltage terminal.

5. The circuit of claim 3, wherein the reversible closing element is a conductive fastener configured to electrically short the open terminals of the electrical write line and the input voltage terminal when inserted in the opening in the printed circuit board.

6. The circuit of claim 1, further comprising a resistor element interposed in the electrical write line between the input voltage terminal and the semiconductor memory device.

7. The circuit of claim 1, wherein the electrical write line is configured to apply the write-protection voltage received at the input voltage terminal to a write-protect pin of the semiconductor memory device.

8. The circuit of claim 1, wherein the reversible closing element is removable.

9. A method comprising:
    applying a write-protection voltage to an input voltage terminal on a printed circuit board carrying a semiconductor memory device; and
    inserting a reversible mechanical fastener into an opening in the printed circuit board to electrically connect the input voltage terminal to an electrical write-data line of the semiconductor memory device to pass the write-protection voltage to the semiconductor memory device to reversibly write protect the semiconductor memory device.

10. The method of claim 9, wherein the electrical write-data line is configured to apply the write-protection voltage received at the input voltage terminal to a write-protect pin of the semiconductor memory device.

11. The method of claim 9, wherein applying a write-protection voltage to an input voltage terminal includes grounding the input voltage terminal.

12. The method of claim 9, wherein the input voltage terminal and the electrical write-data line are connected to respective open terminals including respective conducting pads disposed on the printed circuit board, and inserting the reversible mechanical fastener includes electrically shorting the respective open terminals.

13. The method of claim 12, wherein the reversible mechanical fastener includes a mechanically insertable and removable conductor arranged to electrically short the open terminals of the electrical write-data line and the input voltage terminal.

14. The method of claim 9, wherein the applying the write-protection voltage to an input voltage terminal includes grounding the input voltage terminal.

15. The method of claim 9, wherein the inserting the reversible mechanical fastener in the opening in the printed circuit board to electrically connect the input voltage terminal to the electrical write-data line of the semiconductor memory device to pass the write-protection voltage to the semiconductor memory device includes passing the write-protection voltage across a resistor element interposed in the electrical write-data line between the input voltage terminal and the semiconductor memory device.

16. The method of claim 9, further comprising placing a tamper-evident seal on the reversible mechanical fastener after inserting the reversible mechanical fastener in the opening in the printed circuit board to electrically connect the input voltage terminal to the electrical write-data line of the semiconductor memory device to pass the write-protection voltage to the semiconductor memory device.

17. The method of claim 9, wherein the reversible mechanical fastener is removable.

\* \* \* \* \*